United States Patent
Fritzemeier et al.

(10) Patent No.: US 6,765,151 B2
(45) Date of Patent: Jul. 20, 2004

(54) ENHANCED HIGH TEMPERATURE COATED SUPERCONDUCTORS

(75) Inventors: Leslie G. Fritzemeier, Mendon, MA (US); Cornelis Leo Hans Thieme, Westborough, MA (US); Steven Fleshler, Brookline, MA (US); John D. Scudiere, Bolton, MA (US); Gregory L. Snitchler, Shrewsbury, MA (US); Bruce B. Gamble, Wellesley, MA (US); Robert E. Schwall, Northborough, MA (US); Dingan Yu, Worcester, MA (US); Alexander Otto, Chelmsford, MA (US); Elliott D. Thompson, Coventry, RI (US); Gilbert N. Riley, Jr., Marlborough, MA (US)

(73) Assignee: American Superconductor Corporation, Westborough, MA (US)

( * ) Notice: Subject to any disclaimer, the term of this patent is extended or adjusted under 35 U.S.C. 154(b) by 33 days.

(21) Appl. No.: 10/154,566

(22) Filed: May 24, 2002

(65) Prior Publication Data

US 2002/0144838 A1 Oct. 10, 2002

Related U.S. Application Data

(62) Division of application No. 09/617,518, filed on Jul. 14, 2000.
(60) Provisional application No. 60/145,468, filed on Jul. 23, 1999.

(51) Int. Cl.⁷ ............................................... H01B 12/00
(52) U.S. Cl. ................... 174/125.1; 174/15.5; 505/231; 505/236
(58) Field of Search .......................... 174/125.1, 15.5; 505/230–232, 236–239, 926

(56) References Cited

U.S. PATENT DOCUMENTS 3,763,552 A   10/1973   Brown et al.
3,985,281 A   10/1976   Diepers et al.

(List continued on next page.)

FOREIGN PATENT DOCUMENTS

EP   0 308 869 A2   3/1989

(List continued on next page.)

OTHER PUBLICATIONS

"Dry Etching for VLSI Fabrication", vol. 1, eds. S. Wolf and R.N. Tamber, Lattice Press, Sunset Park, CA, pp. 539–574 (1986).

(List continued on next page.)

*Primary Examiner*—Evan Pert
*Assistant Examiner*—Jose H. Alcala
(74) *Attorney, Agent, or Firm*—Fish & Richardson

(57) ABSTRACT

This invention relates to a practical superconducting conductor based upon biaxially textured high temperature superconducting coatings. In particular, methods for producing flexible and bend strain-resistant articles and articles produced in accordance therewith are described which provide improved current sharing, lower hysteretic losses under alternating current conditions, enhanced electrical and thermal stability and improved mechanical properties between otherwise isolated films in a coated high temperature superconducting (HTS) wire. Multilayered materials including operational material which is sensitive to bend strain can be constructed, in which the bend strain in the region in which such operational material is located is minimized. The invention also provides a means for splicing coated tape segments and for termination of coated tape stack ups or conductor elements.

In one embodiment, a multi-layer high temperature superconductor is provided and includes first and second high temperature superconductor coated elements. Each element includes a substrate, at least one buffer deposited on the substrate, a high temperature superconductor layer, and a cap layer. The first and second high temperature superconductor coated elements are joined at the first and second cap layers.

31 Claims, 5 Drawing Sheets

U.S. PATENT DOCUMENTS

| | | | |
|---|---|---|---|
| 4,442,396 A | | 4/1984 | Hucker |
| 4,659,973 A | | 4/1987 | Stich |
| 4,859,652 A | | 8/1989 | Block |
| 4,882,312 A | | 11/1989 | Mongro-Campero et al. |
| 4,956,340 A | | 9/1990 | Kimura et al. |
| 4,959,347 A | | 9/1990 | Kobayashi et al. |
| 4,994,433 A | | 2/1991 | Chiang |
| 4,994,435 A | | 2/1991 | Shiga et al. |
| 5,038,127 A | | 8/1991 | Dersch |
| 5,051,397 A | * | 9/1991 | Sato et al. .................. 505/230 |
| 5,071,828 A | | 12/1991 | Greuter et al. |
| 5,073,537 A | | 12/1991 | Hung et al. |
| 5,087,605 A | * | 2/1992 | Hegde et al. ............... 505/190 |
| 5,229,358 A | | 7/1993 | Kumar |
| 5,231,074 A | | 7/1993 | Cima et al. |
| 5,236,890 A | | 8/1993 | Murakami et al. |
| 5,304,533 A | | 4/1994 | Kobayashi et al. |
| 5,420,102 A | * | 5/1995 | Harshavardhan et al. ... 505/237 |
| 5,427,055 A | | 6/1995 | Ichikawa |
| 5,449,659 A | | 9/1995 | Garrison et al. |
| 5,480,861 A | * | 1/1996 | Tanaka et al. ............... 505/236 |
| 5,484,766 A | | 1/1996 | Shah et al. |
| 5,567,674 A | * | 10/1996 | Inada et al. ................. 505/475 |
| 5,571,603 A | | 11/1996 | Utumi et al. |
| 5,728,214 A | | 3/1998 | Konishi et al. |
| 5,741,377 A | | 4/1998 | Goyal et al. |
| 5,866,252 A | | 2/1999 | de Rochemont et al. |
| 5,872,080 A | * | 2/1999 | Arendt et al. ............... 505/238 |
| 5,958,599 A | | 9/1999 | Goyal et al. |
| 5,964,966 A | | 10/1999 | Goyal et al. |
| 5,968,877 A | | 10/1999 | Budai et al. |
| 5,981,445 A | | 11/1999 | Kirchnerova et al. |
| 6,022,832 A | | 2/2000 | Fritzemeier et al. |
| 6,027,564 A | | 2/2000 | Fritzemeier et al. |
| 6,077,344 A | | 6/2000 | Shoup et al. |
| 6,159,905 A | * | 12/2000 | Buzcek et al. ............... 505/234 |
| 6,172,009 B1 | | 1/2001 | Smith et al. |
| 6,256,521 B1 | | 7/2001 | Lee et al. |
| 6,309,767 B1 | * | 10/2001 | Nies ........................... 428/689 |
| 6,387,525 B1 | * | 5/2002 | Belenli et al. ............... 428/469 |
| 6,436,317 B1 | * | 8/2002 | Malozemoff et al. ..... 252/519.1 |

FOREIGN PATENT DOCUMENTS

| | | |
|---|---|---|
| EP | 0 387 525 | 9/1990 |
| EP | 0 387 525 A1 | 9/1990 |
| EP | 0 431 782 A1 | 6/1991 |
| EP | 0 506 528 A2 | 9/1992 |
| EP | 0 584 410 A1 | 3/1994 |
| EP | 0 872 579 A1 | 10/1998 |
| JP | 57075564 | 5/1982 |
| JP | 63310366 | 12/1988 |
| WO | 91/16149 | 10/1991 |
| WO | WO 92/05591 | 4/1992 |
| WO | WO 97/05669 | 2/1997 |
| WO | WO 98/58415 | 12/1998 |
| WO | WO 99/16941 | 4/1999 |
| WO | WO 99/17307 | 4/1999 |
| WO | WO 99/25908 | 5/1999 |
| WO | WO 99/35083 | 7/1999 |
| WO | WO 01/98076 | 12/2001 |

OTHER PUBLICATIONS

"Fabrication of High Temperature Superconducting Films Using Perfluoro–Organometallic Precursors", IMB Technical Disclosure Bulletin, vol. 32, No. 5B, Oct. 1989, p 241.

Apicella et al., "The Effects of Surface Contamination On The Biaxially Textured Substrate For YBCO Thick Film Deposition", International Journal of Modern Physics B, vol. 13, Nos. 9 & 10 (1999) pp 997–1004.

Beach et al., "Sol–Gel Synthesis of Rare Earth Aluminate Films as Buffer Layers for High Tc Superconducting Films", Mat. Res. Soc. Symp. Proc. vol. 495, 195, pp 263–270.

Boffa et al., "Laser–ablation deposition of $CeO_2$ thin films on biaxially textured nickel substrates", Physica C 312 (1999) 202–212.

Gupta, et al., "Superconducting oxide films with high transition temperature prepared from metal trifluoroactate precursors," 320 Applied Physics Letters 52 (1988) No. 24, New York, NY, USA.

He et al., "Deposition of biaxilaly–oriented metal and oxide– layer films on textured Ni tapes: new substrates for high– current, high–temperature superconductors", Physica C, 275 (1997) 155–161.

He et al., "Growth of biaxially oriented conductive $LaNiO_3$ buffer layers on textured Ni tapes for high–Tc–coated conductors", Physica C 314 (1999) 105–111.

IBM Technical Disclosure Bulletin, "Fabrication of High Temperature Superconducting Films Using Perfluoro–Organometallic Precursors", vol. 32, No. 5B, Oct. 1989, p. 241.

Koster et al., "flInfluence of the surface treatment on the homoepitaxial growth of $SrTioO_3$", Materials Science and Engineering B56 (1998) 209–212.

Lee et al., "Alternative Buffer Architectures for High Critical Current Density YBCO Superconducting Deposits on Rolling Assisted Biaxially–Textured Substrates", Jpn. J. Appl. Phys. vol. 38 (1999) Pt. 2, No. 2B, pp 178–180.

McIntyre et al., "Epitaxial nucleation and growth of chemically derived $Ba_2Ycu_3O_{7-x}$ thin films on (001) $SrTiO_3$", Journal of Applied Physics, 77 (1995) 15 May, No. 10, pp 5263–5272.

McIntyre et al., "Effects of growth conditions on the properties and morphology of chemically derived epitaxial thin films on $Ba_2Ycu_3O_{7-x}$ on (001) $LaAIO_3$", J. Appl. Phys. 71 (4), Feb. 15, 1992, pp 1868–1877.

Moore et al., "Sol–Gel Processing of $Y_1Ba_2Cu_3O_{7-x}$ Using Alkoxide Precursors: Two Systems Yielding High Degrees of Thin Film Orientation and Crystal Growth", Materials Letters, vol 7, No. 12, Mar. 1989, pp 415–424.

Paranthaman et al., Growth of biaxially textured $RE_2O_3$ buffer layers on rolled–Ni substrates using reactive evaporation for HTS–coated conductors, Supercond. Sci. Techno. 12(1999) 319–315. Printed in the UK.

Qing He, D.K. et al., "Deposition of biaxially–oriented metal and oxide buffer–layer films on textured Ni tapes: new substrates for high–current, high–temperature superconductors", *Physica C*, vol. 275 (1997) pp. 155–161.

Rupich et al., "Growth and Characterization of Oxide Buffer Layers for YBCO Coated Conductors", IEEE Transactions on Applied Superconductivity, vol. 9, No. 2, Jun. 1999, pp 1527–1530.

Rupich et al., "Synthesis of superconductors from soluble metal oxo alkoxide precursors", J. Mater. Res., vol. 8, No. 7, Jul 1993, pp 1487–1496.

Sheth et al., "Bench Scale Evaluation of Batch Mode Dip–Coating of Sol–Gel $LaAlO_3$ Buffer Material", IEEE Transactions on Applied Superconductivity, vol. 9, No. 2, Jun. 1999, pp 1514–1518.

Shoup et al., "Epitaxial Thin Film Growth of Lanthanum and Neodymium Aluminate Films on Roll–Textured Nickel Using a Sol–Gel Method", Journal of the American Ceramic Society, vol. 81, No. 11, Nov. 1998, pp–3019–3021.

Smith et al., "High Critical Current Density Thick MOD–Derived YBCO Films", IEEE Transactions on Applied Superconductivity, vol. 9, No. 2, Jun. 1999, pp 1531–1534.

Tanaka et al., "Improvement of $YBa_2Cu_3O_2$ Single–Crystal Surface by Chemical Etching", Jpn. J. App. Phys. vol. 38 (1999) pp L731–L733, Part 2, No. 7A, Jul. 1, 1999.

U.S. patent application No. 09/500,701, filed Feb. 9, 2000, Buczek et al.

U.S. patent application No. 09/500,717, filed Feb. 9, 2000, Fritzmeier et al.

U.S. patent application No. 09/500,718, filed Feb. 9, 2000, Malozemoff et al.

U.S. patent application No. 09/579,193, filed May 26, 2000, Malozemoff et al.

U.S. patent application No. 09/615,669, filed Jul. 14, 2000, Buczek et al.

U.S. patent application No. 09/616,566, filed Jul. 14, 2000, Zhang et al.

U.S. patent application No. 09/616,570, filed Jul. 14, 2000, Fritzmeier et al.

U.S. patent application No. 09/617,570, filed Jul. 14, 2000, Lu et al.

* cited by examiner

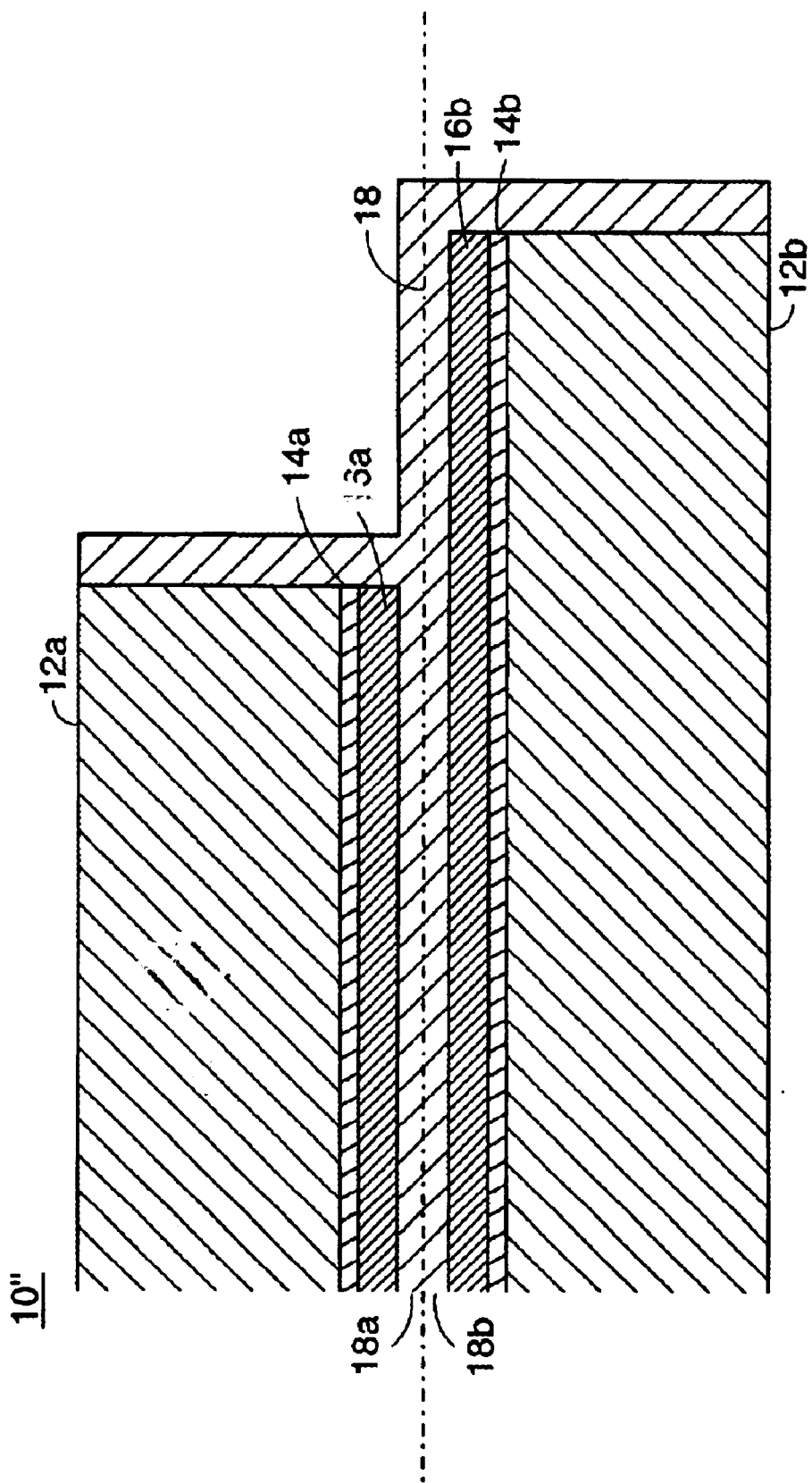

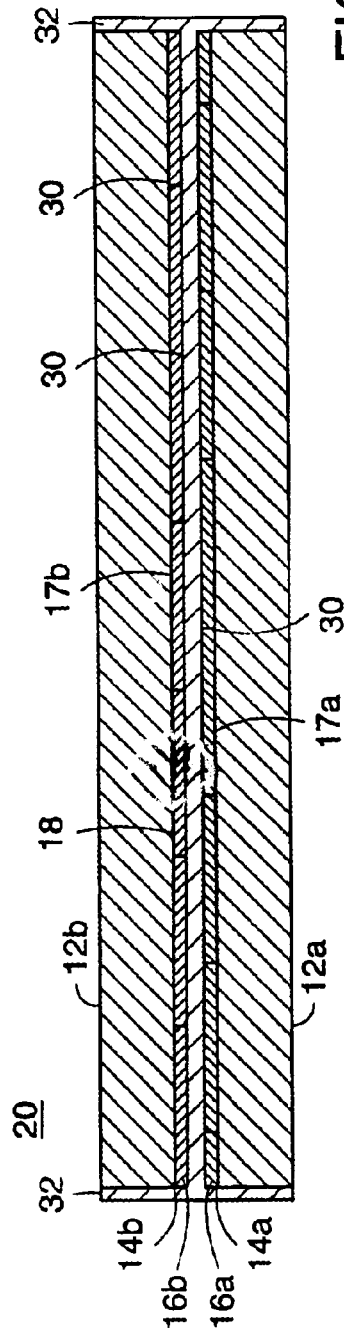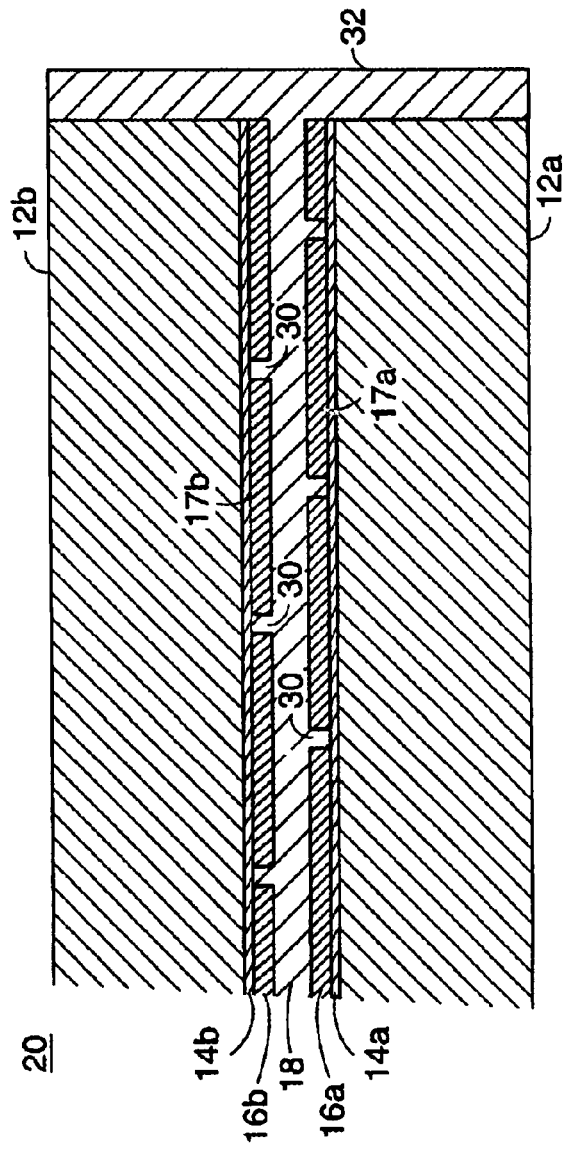

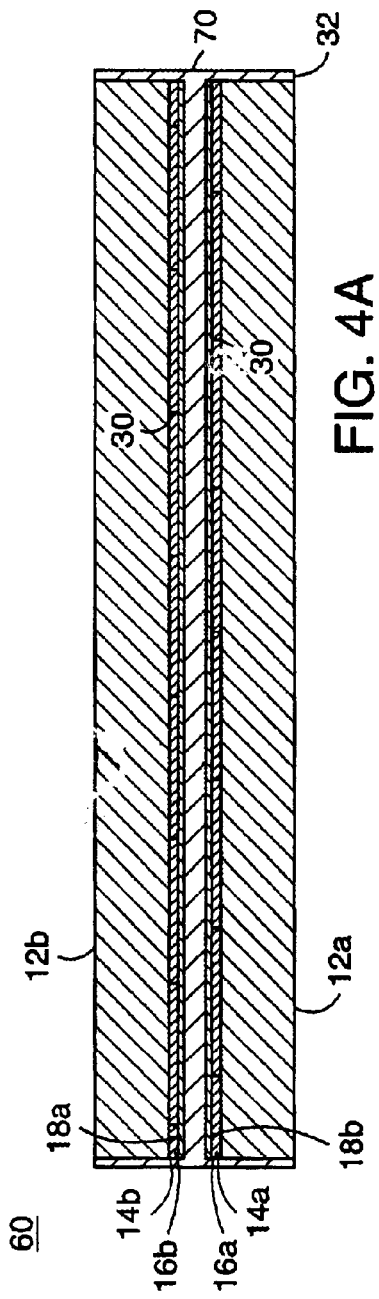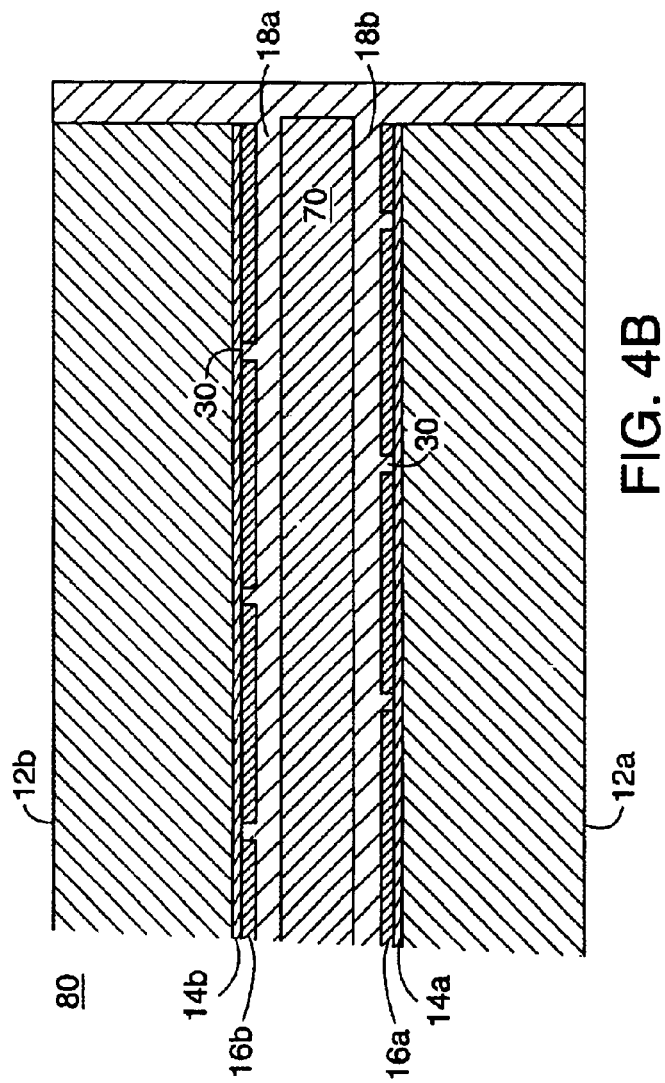

ENHANCED HIGH TEMPERATURE COATED SUPERCONDUCTORS

This application is a divisional and claims priority under 35 U.S.C. 0120 to U.S. patent application Ser. No. 09/617,518, filed Jul. 14, 2000, entitled "Enhanced High Temperature Coated Superconductors," which in turn claims priority under 35 U.S.C. §119(e)(1) to U.S. Provisional Patent Application No. 60/145,468, filed Jul. 23, 1999, entitled "Enhanced High Temperature Coated Superconductors," which incorporated herein by reference.

TECHNICAL FIELD

The present invention generally relates to methods for manufacturing enhanced current sharing for coated conductor high temperature superconducting tapes and articles formed in accordance therewith.

BACKGROUND

Development efforts in the area of coated high temperature superconductors ("HTS") thus far have been directed at production of single tapes, that is, tapes typically including a substrate that can be textured or untextured, one or more biaxially textured buffer layers, an epitaxial HTS layer, and cap layers. In particular, attempts have been directed toward the production of high current carrying tapes from single substrate layers. In an effort to improve the overall current carrying capability of those proposed single tapes, high temperature superconductor (HTS) films will need to be very thick or will have to be deposited on both sides of a single substrate. Additionally, the articles created utilizing such construction present an unfavorable architecture regarding several critical performance parameters, including critical stress or strain parameters.

The use of a single tape with a very thick superconducting layer will not be practical for commercial applications. This may in part be due to the likelihood of the HTS layer to fracture as the thickness of the HTS layer increases (i.e. a known reduction in fracture strength). It is also likely that thickness will be limited by difficulty in controlling texture, and hence performance, as the HTS layer grows.

While current carrying capability may be improved by depositing a superconducting layer on each side of the substrate, this approach suffers other potential drawbacks. For example, the handling and processing of such a tape will be difficult relative to a single sided tape. In addition, the HTS films for two sided tapes will be in the least favorable position for several critical performance parameters.

Moreover, the possible use of conductive buffer layers to provide for a current path between the HTS filament and the substrate has been discussed extensively. While this solution appears to be possible it is severely limiting. The choices of conductive materials are limited because they should provide chemical compatibility with the superconductor and the substrate, exhibit a lattice match that enables epitaxial growth from the substrate, provide a template for epitaxial superconductor growth and possess good mechanical and physical properties. This is especially true since the resistance at the interface between the buffer and any other layer will govern the current transfer. It is likely that this interfacial resistance will still be high relative to the bulk resistance of the conductive buffer layer. The growth of a native oxide layer from the substrate material, which further increases the resistivity between the substrate and the buffer layer, is also likely to occur.

In the context of HTS coated conductors, it would therefore be desirable to provide methods and articles that overcome the shortcomings associated with the prior art.

SUMMARY OF THE INVENTION

This invention relates to a practical superconducting conductor based upon biaxially textured high temperature superconducting coatings. In particular, methods for producing articles, and articles produced in accordance therewith, are described which provide improved current sharing, lower hysteretic losses under alternating current conditions, enhanced electrical and thermal stability and improved mechanical properties between otherwise isolated films in a coated high temperature superconducting (HTS) wire. The invention also provides a means for splicing coated tape segments and for termination of coated tape stack ups or conductor elements. The invention further relates to multilayered materials which include sensitive HTS operational layers that can have laminate materials layered onto the multilayered materials so as to achieve desirable electrical, magnetic, thermal and mechanical properties of the composite tape.

In one embodiment, a multi-layer high temperature superconductor is provided and includes first and second high temperature superconductor coated elements. Each element includes a substrate, at least one buffer deposited on the substrate, a high temperature superconductor layer, and a cap layer. The first and second high temperature superconductor coated elements are joined at the first and second cap layers. Alternatively, if cap layers are not present, the first and second HTS coated elements are joined with an intervening, typically metallic, layer between the two HTS layers.

In one aspect, the invention provides a multi-layer high temperature superconductor, including a first high temperature superconductor coated element, which includes a first substrate (which can be biaxially textured, for example, be deformation); at least one first buffer deposited on the first substrate (which can be metal oxides, for example cerium oxide and/or gadolinium oxide, and can further optionally include yttria stabilized zirconia, all of which can be epitaxially deposited); at least one first high temperature superconductor layer (which can include metal oxide, such as rare earth oxide, including $(RE)Ba_2Cu_3O_{7-\delta}$, wherein RE is selected from the group consisting of rare earth elements and yttrium, and $\delta$ is a number greater than zero and less than one); and a first cap layer. The multi-layer high temperature superconductor also includes a second high temperature superconductor coated element, which includes a second substrate; at least one second buffer deposited on the second substrate; at least one second high temperature superconductor layer; and a second cap layer, where the first and second high temperature superconductor coated elements are joined at the first and second cap layers. The first or second substrates can include nickel, such as for example, nickel-chromium, nickel-copper, or nickel-vanadium alloys. At least two buffers, for example three buffers, can be sequentially deposited on the first substrate. The first cap layer can be deposited on the first high temperature superconducting layer. The first and second substrates, the first and second buffers, the first and second high temperature superconducting layers, and the first and second cap layers can independently be of substantially identical composition. Thus, the first and second high temperature superconductor coated elements can be of substantially identical composition. The the first and second cap layers can be continuously joined at their uppermost surfaces. Alternately, the first and second cap layers can be a single continuous layer. The superconductor can be in the form of a tape. The substrates can optionally be substantially untextured, and the buffers and high temperature superconductor layers can be biaxially textured. The first and second high temperature superconductor coated elements can be registered at their respective edges. The first and second high temperature superconductor coated elements can be offset along their lengths. At least one of the first and second cap layers can extend along the edge of at least the first and second high temperature superconductor coated element. The superconductor can include a multifilamentary structure, such as when the first and second high temperature superconducting layers are divided into a plurality of filaments. The superconductor can further include a stabilizer, where the first and second cap layers can be joined to opposing surfaces of the stabilizer.

In a further aspect, the invention provides another multi-layer high temperature superconductor, including a first high temperature superconductor coated element, which includes a first substrate; at least one first buffer deposited on the first substrate; at least one first high temperature superconductor layer; and a first cap layer. The superconductor also includes a second high temperature superconductor coated element, which includes a second substrate; at least one second buffer deposited on the second substrate; at least one second high temperature superconductor layer; and a second cap layer, where the first and second high temperature superconductor coated elements are joined with an intervening metallic layer.

In yet a further aspect, the invention provides a multi-layer high temperature superconductor, as described immediately above but without cap layers, where the first and second high temperature superconductor coated elements are joined with an intervening metallic is layer.

Unless otherwise defined, all technical and scientific terms used herein have the same meanings as commonly understood by one of ordinary skill in the art to which this invention belongs. Although methods and materials similar or equivalent to those described herein can be used in-the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

BRIEF DESCRIPTION OF THE DRAWINGS

For a fuller understanding of the present invention, reference is had to the following description taken in conjunction with the accompanying drawings, in which:

FIG. 2C is an illustration of another alternative embodiment of an HTS coated conductor in accordance with the present invention;

FIG. 3A is an illustration of yet another alternative embodiment of an HTS coated conductor in accordance with the present invention;

FIG. 3B is an illustration of an expanded view of FIG. 3A;

FIG. 4A is an illustration of yet another alternative embodiment of an HTS coated conductor in accordance with the present invention; and FIG. 4B is an illustration of an expanded view of FIG. 4A.

Similar reference characters refer to similar parts throughout the several views of the drawings.

DETAILED DESCRIPTION

Figure 1A:
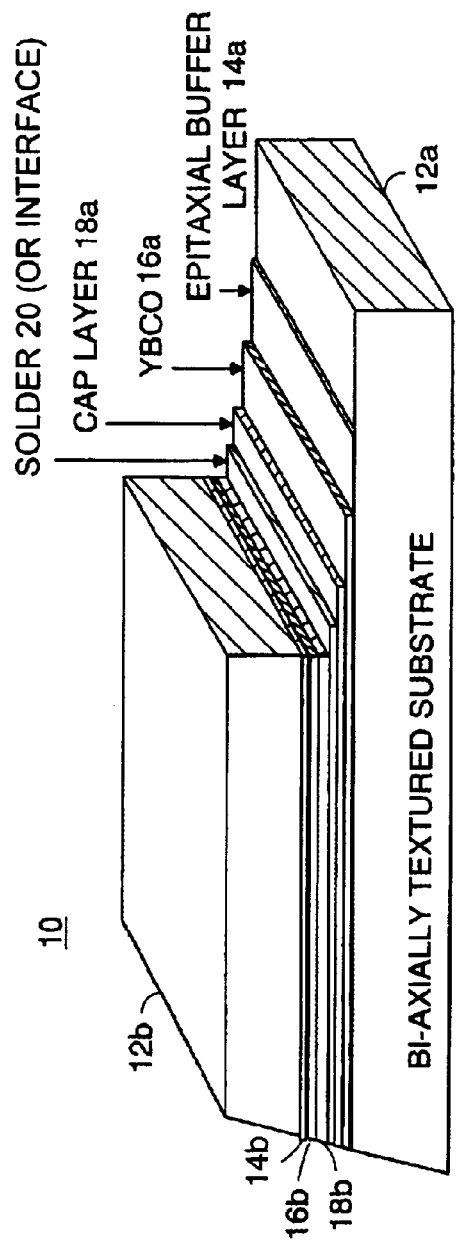
FIG. 1A is an illustration of an HTS coated conductor in accordance with the present invention.

This invention relates to a practical superconducting wire based upon biaxially textured high temperature superconducting coatings. In particular, methods for producing articles, and articles produced in accordance therewith, are described which provide improved current sharing, lower hysteretic losses under alternating current conditions, enhanced electrical and thermal stability and improved mechanical properties between otherwise isolated films in a coated high temperature superconducting (HTS) wire. Specific configurations of such articles are designed in such a way as to substantially avoid mechanical degradation of the operational HTS layer during bending. The material can be used in a variety of applications which employ operational HTS layers. For example, the flexible material can be used in high temperature superconducting tapes with additional electrical, magnetic, electro-optic, dielectric, thermal, mechanical or environmental (protective) properties. The invention also provides a means for splicing coated tape segments and for termination of coated tape stack ups or conductor elements.

A number of important issues must be addressed in order to develop a commercially viable conductor that can advantageously use the performance benefits of the biaxially textured HTS films. For example, well-textured, high critical current density HTS films can only be produced by epitaxial growth on a flat, open surface. In addition, HTS oxide films cannot sustain high levels of strain without fracture and loss of electrical continuity. A means to mitigate this strain is desirable. Moreover, unlike first generation HTS wire, which contains a multitude of filaments that can share electrical current transport, the biaxially textured films consist of a single, wide filament. Damage in a single filament could result in local heating and increase the risk of thermal runaway and quenching of the superconducting state, rendering the conductor useless. Further, transfer of current into and out of an isolated HTS layer is also a necessary consideration for practical conductors. Recall that the layers for a conductor made of stacked single tapes would be separated by the substrate, an oxide buffer layer and a capping layer. Current transfer is required to provide for splicing of lengths of conductor and to provide current transfer at conductor terminations.

It is therefore desirable to provide for a useful conductor having multiple tapes stacked relative to one another and/or laminated to provide sufficient ampacity, dimensional stability and mechanical strength. Many, if not all of the above practical issues can be addressed by appropriate engineering of the conductor architecture to take advantage of two or more superconducting layers in close proximity to each other. As described herein, two superconducting layers are bonded "face-to-face" with an intervening layer, preferably metallic, which may or may not include cap layers. Additional layers may be laminated, particularly in ways which keep the neutral mechanical axis under bending at or near the two superconducting layers.

The commercial production of practical superconducting wires based upon coated HTS (e.g. YBCO) tapes now appears feasible following disclosure of high critical current densities in films produced on flexible metallic substrates. Y, Ba and Cu can be present in a stoichiometry of 1:2:3, respectively.

The substrate can be formed of alloys having one or more surfaces that are biaxially textured (e.g., (113)[211]) or cube textured (e.g., (100)[001] or (100)[011]). The alloys can have a relatively low Curie temperature (e.g., at most about 80 K, at most about 40 K, or at most about 20 K).

In certain embodiments, the substrate is a binary alloy that contains two of the following metals: copper, nickel, chromium, vanadium, aluminum, silver, iron, palladium, molybdenum, gold and zinc. For example, a binary alloy can be formed of nickel and chromium (e.g., nickel and at most 20 atomic percent chromium, nickel and from about five to about 18 atomic percent chromium, or nickel and from about 10 to about 15 atomic percent chromium). As another example, a binary alloy can be formed of nickel and copper (e.g., copper and from about five to about 45 atomic percent nickel, copper and from about 10 to about 40 atomic percent nickel, or copper and from about 25 to about 35 atomic percent nickel). A binary alloy can further include relatively small amounts of impurities (e.g., less than about 0.1 atomic percent of impurities, less than about 0.01 atomic percent of impurities, or less than about 0.005 atomic percent of impurities).

In some embodiments, the substrate contains more than two metals (e.g., a ternary alloy or a quarternary alloy). In these embodiments the alloy can contain one or more oxide formers (e.g., Mg, Al, Ti, Cr, Ga, Ge, Zr, Hf, Y, Si, Pr, Eu, Gd, Tb, Dy, Ho, Lu, Th, Er, Tm, Be, Ce, Nd, Sm, Yb and/or La, with Al being the preferred oxide former), as well as two of the following metals: copper, nickel, chromium, vanadium, aluminum, silver, iron, palladium, molybdenum, gold and zinc. The alloys can contain at least about 0.5 atomic percent oxide former (e.g., at least about one atomic percent oxide former, or at least about two atomic percent oxide former) and at most about 25 atomic percent oxide former (e.g., at most about 10 atomic percent oxide former, or at most about four atomic percent oxide former). For example, the alloy can include an oxide former (e.g., at least about 0.5 aluminum), from about 25 atomic percent to about 55 atomic percent nickel (e.g., from about 35 atomic percent to about 55 atomic percent nickel, or from about 40 atomic percent to about 55 atomic percent nickel) with the balance being copper. As another example, the alloy can include an oxide former (e.g., at least about 0.5 atomic aluminum), from about five atomic percent to about 20 atomic percent chromium (e.g., from about 10 atomic percent to about 18 atomic percent chromium, or from about 10 atomic percent to about 15 atomic percent chromium) with the balance being nickel. The alloys can include relatively small amounts of impurities (e.g., less than about 0.1 atomic percent of impurities, less than about 0.01 atomic percent of impurities, or less than about 0.005 atomic percent of impurities).

An alloy can be produced by, for example, combining the constituents in powder form, melting and cooling or, for example, by diffusing the powder constituents together in solid state. The alloy can then be formed by deformation texturing (e.g, annealing and rolling, swaging, extrusion and/or drawing) to form a textured surface (e.g., biaxially textured or cube textured). Alternatively, the alloy constituents can be stacked in a jelly roll configuration, and then deformation textured. In some embodiments, a material with a relatively low coefficient of thermal expansion (e.g, Nb, Mo, Ta, V, Cr, Zr, Pd, Sb, NbTi, an intermetallic such as NiAl or $Ni_3Al$, or mixtures thereof) can be formed into a rod and embedded into the alloy prior to deformation texturing.

These methods are described in commonly owned U.S. patent application Ser. No. 09/283,775, filed Mar. 31, 1999, and entitled "Alloy Materials;" commonly owned U.S. patent application Ser. No. 09/283,777, filed Mar. 31, 1999, and entitled "Alloy Materials;" PCT Publication No. WO 99/17307, published on Apr. 8, 1999, and entitled "Substrates with Improved Oxidation Resistance;" and PCT Publication No. WO 99/16941, published on Apr. 8, 1999, and entitled "Substrates for Superconductors," all of which are hereby incorporated by reference. Non-textured substrates can be used when a texturing process is used (see below).

In some embodiments, stable oxide formation can be mitigated until a first epitaxial (for example, buffer) layer is formed on the biaxially textured alloy surface, using an intermediate layer disposed on the surface of the substrate. Intermediate layers suitable for use in the present invention include those epitaxial metal or alloy layers that do not form surface oxides when exposed to conditions as established by $P_{O2}$ and temperature required for the initial growth of epitaxial buffer layer films. In addition, the buffer layer acts as a barrier to prevent substrate element(s) from migrating to the surface of the intermediate layer and forming oxides during the initial growth of the epitaxial layer. Absent such an intermediate layer, one or more elements in the substrate would be expected to form thermodynamically stable oxide (s) at the substrate surface which could significantly impede the deposition of epitaxial layers due to, for example, lack of texture in this oxide layer.

In some embodiments, the intermediate layer is transient in nature. "Transient," as used herein, refers to an intermediate layer that is wholly or partly incorporated into or with the biaxially textured substrate following the initial nucleation and growth of the epitaxial film. Even under these circumstances, the intermediate layer and biaxially textured substrate remain distinct until the epitaxial nature of the deposited film has been established. The use of transient intermediate layers may be preferred when the intermediate layer possesses some undesirable property, for example, the intermediate layer is magnetic, such as nickel.

Exemplary intermediate metal layers include nickel, gold, silver, palladium, and alloys thereof. Impurities or alloys may include alloys of nickel and/or copper. Epitaxial films or layers deposited on an intermediate layer can include metal oxides, chalcogenides, halides, and nitrides. In preferred embodiments, the intermediate metal layer does not oxidize under epitaxial film deposition conditions.

Care should be taken that the deposited intermediate layer is not completely incorporated into or does not completely diffuse into the substrate before nucleation and growth of the initial buffer layer structure causes the epitaxial layer to be established. This means that after selecting the metal (or alloy) for proper attributes such as diffusion constant in the substrate alloy, thermodynamic stability against oxidation under practical epitaxial buffer layer growth conditions and lattice matching with the epitaxial layer, the thickness of the deposited metal layer has to be adapted to the epitaxial layer deposition conditions, in particular to temperature.

Deposition of the intermediate metal layer can be done in a vacuum process such as evaporation or sputtering, or by electro-chemical means such as electroplating (with or without electrodes). These deposited intermediate metal layers may or may not be epitaxial after deposition (depending on substrate temperature during deposition), but epitaxial orientation can subsequently be obtained during a post-deposition heat treatment.

In certain embodiments, the formation of oxide buffer layers can be carried out so as to promote wetting of an underlying substrate layer. Additionally, in particular embodiments, the formation of metal oxide layers can be carried out using metal alkoxide precursors (for example, "sol gel" precursors), in which the level of carbon contamination can be greatly reduced over other known processes using metal alkoxide precursors.

In certain embodiments, solution coating processes can be used for deposition of one or a combination of any of the oxide layers on textured substrates; however, they can be particularly applicable for deposition of the initial (seed) layer on a textured metal substrate. The role of the seed layer is to provide 1) protection of the substrate from oxidation during deposition of the next oxide layer when carried out in an oxidizing atmosphere relative to the substrate (for example, magnetron sputter deposition of yttria-stabilized zirconia from an oxide target); and 2) an epitaxial template for growth of subsequent oxide layers. In order to meet these requirements, the seed layer should grow epitaxially over the entire surface of the metal substrate and be free of any contaminants that may interfere with the deposition of subsequent epitaxial oxide layers.

The formation of oxide buffer layers can be carried out so as to promote wetting of an underlying substrate layer. Additionally, in particular embodiments, the formation of metal oxide layers can be carried out using metal alkoxide precursors (for example, "sol gel" precursors), in which the level of carbon contamination can be greatly reduced over other known processes using metal alkoxide precursors.

This heating step can be carried out after, or concurrently with, the drying of excess solvent from the sol gel precursor film. It must be carried out prior to decomposition of the precursor film, however.

The carbon contamination accompanying conventional oxide film preparation in a reducing environment (e.g., 4% $H_2$—Ar) is believed to be the result of an incomplete removal of the organic components of the precursor film. The presence of carbon-containing contaminants $C_xH_y$ and $C_aH_bO_c$ in or near the oxide layer can be detrimental, since they can alter the epitaxial deposition of subsequent oxide layers. Additionally, it is likely that the trapped carbon-containing contaminants buried in the film can be oxidized during the processing steps for subsequent oxide layers, which can utilize oxidizing atmospheres. The oxidation of the carbon-containing contaminants can result in $CO_2$ formation, and the subsequent blistering of the film, and possible delamination of the film, or other defects in the composite structure. Thus, it is undesirable to allow carbon-containing contaminants arising from metal alkoxide decomposition to become oxidized only after the oxide layer is formed. Preferably, the carbon-containing contaminants are oxidized (and hence removed from the film structure as $CO_2$) as the decomposition occurs. Also the presence of carbon-containing species on or near film surfaces can inhibit the epitaxial growth of subsequent oxide layers.

According to particular embodiments, after coating a metal substrate or buffer layer, the precursor solution can be air dried, and then heated in an initial decomposition step. Alternatively, the precursor solution can be directly heated in an initial decomposition step, under an atmosphere that is reducing relative to the metal substrate. Once the oxide layer initially nucleates on the metal substrate in the desired epitaxial orientation, the oxygen level of the process gas is increased, for example, by adding water vapor or oxygen. The nucleation step requires from about 5 minutes to about 30 minutes to take place under typical conditions. These methods are described in U.S. patent application Ser. No. 09/617,520, filed on even date herewith, and entitled "Enhanced Purity Oxide Layer Formation," which is hereby incorporated by reference.

In certain embodiments, an epitaxial buffer layer can be formed using a low vacuum vapor deposition process (e.g., a process performed at a pressure of at least about $1\times10^{-3}$ Torr). The process can include forming the epitaxial layer using a relatively high velocity and/or focused gas beam of buffer layer material.

The buffer layer material in the gas beam can have a velocity of greater than about one meter per second (e.g., greater than about 10 meters per second or greater than about 100 meters per second). At least about 50% of the buffer layer material in the beam can be incident on the target surface (e.g., at least about 75% of the buffer layer material in the beam can be incident on the target surface, or at least about 90% of the buffer layer material in the beam can be incident on the target surface).

The method can include placing a target surface (e.g., a substrate surface or a buffer layer surface) in a low vacuum environment, and heating the target surface to a temperature which is greater than the threshold temperature for forming an epitaxial layer of the desired material on the target surface in a high vacuum environment (e.g., less than about $1\times10^{-3}$ Torr, such as less than about $1\times10^{-4}$ Torr) under otherwise identical conditions. A gas beam containing the buffer layer material and optionally an inert carrier gas is directed at the target surface at a velocity of at least about one meter per second. A conditioning gas is provided in the low vacuum environment. The conditioning gas can be contained in the gas beam, or the conditioning gas can be introduced into the low vacuum environment in a different manner (e.g., leaked into the environment). The conditioning gas can react with species (e.g., contaminants) present at the target surface to remove the species, which can promote the nucleation of the epitaxial buffer layer.

The epitaxial buffer layer can be grown on a target surface using a low vacuum (e.g., at least about $1\times10^{-3}$ Torr, at least about 0.1 Torr, or at least about 1 Torr) at a surface temperature below the temperature used to grow the epitaxial layer using physical vapor deposition at a high vacuum (e.g., at most about $1\times10^{-4}$ Torr). The temperature of the target surface can be, for example, from about 25° C. to about 800° C. (e.g., from about 500° C. to about 800° C., or from about 500° C. to about 650° C.). The epitaxial layer can be grown at a relatively fast rate, such as, for example, at least about 50 Angstroms per second.

These methods are described in U.S. Pat. No. 6,027,564, issued Feb. 22, 2000, and entitled "Low Vacuum Process for Producing Epitaxial Layers;" U.S. Pat. No. 6,022, 832, issued Feb. 8, 2000, and entitled "Low Vacuum Process for Producing Superconductor Articles with Epitaxial Layers;" and/or commonly owned U.S. patent application Ser. No. 09/007,372, filed Jan. 15, 1998, and entitled "Low Vacuum Process for Producing Epitaxial Layers of Semiconductor Material," all of which are hereby incorporated by reference.

In some embodiments, a buffer layer can be formed using ion beam assisted deposition (IBAD). In this technique, a buffer layer material is evaporated using, for example, electron beam evaporation, sputtering deposition, or pulsed laser deposition while an ion beam (e.g., an argon ion beam) is directed at a smooth amorphous surface of a substrate onto which the evaporated buffer layer material is deposited.

For example, the buffer layer can be formed by ion beam assisted deposition by evaporating a buffer layer material having a rock-salt like structure (e.g., a material having a rock salt structure, such as an oxide, including MgO, or a nitride) onto a smooth, amorphous surface (e.g., a surface having a root mean square roughness of less than about 100 Angstroms) of a substrate so that the buffer layer material has a surface with substantial alignment (e.g., about 13° or less), both in-plane and out-of-plane.

The conditions used during deposition of the buffer layer material can include, for example, a substrate temperature of from about 0° C. to about 400° C. (e.g., from about room temperature to about 400° C.), a deposition rate of from about 1.0 Angstrom per second to about 4.4 Angstroms per second, an ion energy of from about 200 eV to about 1200 eV, and/or an ion flux of from about 110 microamperes per square centimeter to about 120 microamperes per square centimeter.

In some embodiments, the substrate is formed of a material having a polycrystalline, non-amorphous base structure (e.g., a metal alloy, such as a nickel alloy) with a smooth amorphous surface formed of a different material (e.g., $Si_3N_4$).

In certain embodiments, a plurality of buffer layers can be deposited by epitaxial growth on an original IBAD surface. Each buffer layer can have substantial alignment (e.g., about 13° or less), both in-plane and out-of-plane. These methods are described in PCT Publication No. WO 99/25908, published on May 27, 1999, and entitled "Thin Films Having A Rock-Salt-Like Structure Deposited on Amorphous Surfaces," which is hereby incorporated by reference.

In some embodiments, an epitaxial buffer layer can be deposited by sputtering from a metal or metal oxide target at a high throughput. Heating of the substrate can be accomplished by resistive heating or bias and electric potential to obtain an epitaxial morphology. A deposition dwell may be used to form an oxide epitaxial film from a metal or metal oxide target.

The oxide layer typically present on substrates can be removed by exposure of the substrate surface to energetic ions within a reducing environment, also known as Ion Beam etching. Ion Beam etching can be used to clean the substrate prior to film deposition, by removing residual oxide or impurities from the substrate, and producing an essentially oxide-free preferably biaxially textured substrate surface. This improves the contact between the substrate and subsequently deposited material. Energetic ions can be produced by various ion guns, for example, which accelerate ions such as $Ar^+$ toward a substrate surface. Preferably, gridded ion sources with beam voltages greater than 150 ev are utilized. Alternatively, a plasma can be established in a region near the substrate surface. Within this region, ions chemically interact with a substrate surface to remove material from that surface, including metal oxides, to produce substantially oxide-free metal surface.

Another method to remove oxide layers from a substrate is to electrically bias the substrate. If the substrate tape or wire is made negative with respect to the anode potential, it will be subjected to a steady bombardment by ions from the gas prior to the deposition (if the target is shuttered) or during the entire film deposition. This ion bombardment can clean the wire or tape surface of absorbed gases that might otherwise be incorporated in the film and also heat the substrate to elevated deposition temperatures. Such ion bombardment can be further advantageous by improving the density or smoothness of the epitaxial film.

Upon formation of an appropriately textured, substantially oxide-free substrate surface, deposition of a buffer layer can begin. One or more buffer layers, each including a single metal or oxide layer, can be used. In some preferred embodiments, the substrate is allowed to pass through an apparatus adapted to carry out steps of the deposition method of these embodiments. For example, if the substrate is in the form of a wire or tape, the substrate can be passed linearly from a payout reel to a take-up reel, and steps can be performed on the substrate as it passes between the reels.

According to some embodiments, substrate materials are heated to elevated temperatures which are less than about 90% of the melting point of the substrate material but greater than the threshold temperature for forming an epitaxial layer of the desired material on the substrate material in a vacuum environment at the predetermined deposition rate. In order to form the appropriate buffer layer crystal structure and buffer layer smoothness, high substrate temperatures are generally preferred. Typical lower limit temperatures for the growth of oxide layers on metal are approximately 200° C. to 800° C., preferably 500° C. to 800° C., and more preferably, 650° C. to 800° C. Various well-known methods such as radiative heating, convection heating, and conduction heating are suitable for short (2 cm to 10 cm) lengths of substrate, but for longer (1 m to 100 m) lengths, these techniques may not be well suited. Also-to obtain desired high throughput rates in a manufacturing process, the substrate wire or tape must be moving or transferring between deposition stations during the process. According to particular embodiments, the substrates are heated by resistive heating, that is, by passing a current through the metal substrate, which is easily scaleable to long length manufacturing processes. This approach works well while instantaneously allowing for rapid travel between these zones. Temperature control can be accomplished by using optical pyrometers and closed loop feedback systems to control the power supplied to the substrate being heated. Current can be supplied to the substrate by electrodes which contact the substrate in at least two different segments of the substrate. For example, if the substrate, in the form of a tape or wire, is passed between reels, the reels themselves could act as electrodes. Alternatively, if guides are employed to transfer the substrate between reels, the guides could act as electrodes. The electrodes could also be completely independent of any guides or reels as well. In some preferred embodiments, current is applied to the tape between current wheels.

In order that the deposition is carried out on tape that is at the appropriate temperature, the metal or oxide material that is deposited onto the tape is desirably deposited in a region between the current wheels. Because the current wheels can be efficient heat sinks and can thus cool the tape in regions proximate to the wheels, material is desirably not deposited in regions proximate to the wheels. In the case of sputtering, the charged material deposited onto the tape is desirably not influenced by other charged surfaces or materials proximate to the sputter flux path. For this reason, the sputter chamber is preferably configured to place components and surfaces which could influence or deflect the sputter flux, including chamber walls, and other deposition elements, in locations distant from the deposition zone so that they do not alter the desired deposition of metal or metal oxide in regions of the tape at the proper deposition temperature.

More details are provided in commonly owned U.S. patent application Ser. No. 09/500,701, filed on Feb. 9, 2000, and entitled "Oxide Layer Method," and commonly owned U.S. patent application Ser. No. 09/500,701, filed on even date herewith, and entitled "Oxide Layer Method," both of which are hereby incorporated by reference in their entirety.

In preferred embodiments, three buffer layers are used. A layer of $Y_2O_3$ or $CeO_2$ (e.g., from about 20 nanometers to about 50 nanometers thick) is deposited (e.g., using electron beam evaporation) onto the substrate surface. A layer of YSZ (e.g., from about 0.2 micron to about 1 micron thick, such as about 0.5 micron thick) is deposited onto the surface of the $Y_2O_3$ or $CeO_2$ layer using sputtering (e.g, using magnetron sputtering). A $CeO_2$ layer (e.g., about 20 nanometers thick) is deposited (e.g, using magnetron sputttering) onto the YSZ surface. The surface of one or more of these layers can be chemically and/or thermally conditioned as described herein.

In certain embodiments, the underlying layer (e.g., a buffer layer or a different superconductor layer) can be conditioned (e.g., thermally conditioned and/or chemically conditioned) so that the superconductor layer is formed on a conditioned surface. The conditioned surface of the underlying layer can be biaxially textured (e.g., (113)[211]) or cube textured (e.g., (100)[011] or (100)[011]), have peaks in an X-ray diffraction pole figure that have a full width at half maximum of less than about 20° (e.g., less than about 15°, less than about 10°, or from about 5° to about 10°), be smoother than before conditioning as determined by high resolution scanning electron microscopy or atomic force microscopy, have a relatively high density, have a relatively low density of impurities, exhibit enhanced adhesion to other material layers (e.g., a superconductor layer or a buffer layer) and/or exhibit a relatively small rocking curve width as measured by x-ray diffraction.

"Chemical conditioning" as used herein refers to a process which uses one or more chemical species (e.g., gas phase chemical species and/or solution phase chemical species) to affect changes in the surface of a material layer, such as a buffer layer or a superconductor material layer, so that the resulting surface exhibits one or more of the above noted properties.

"Thermal conditioning" as used herein refers to a process which uses elevated temperature with or without chemical conditioning to affect changes in the surface of a material layer, such as a buffer layer or a superconductor material layer, so that the resulting surface exhibits one or more of the above noted properties. Preferably, thermal conditioning occurs in a controlled environment (e.g., controlled gas pressure, controlled gas environment and/or controlled temperature).

Thermal conditioning can include heating the surface of the underlying layer to a temperature at least about 5° C. above the deposition temperature or the crystallization temperature of the underlying layer (e.g., from about 15° C. to about 500° C. above the deposition temperature or the crystallization temperature of the underlying layer, from about 75° C. to about 300° C. above the deposition temperature or the crystallization temperature of the underlying layer, or from about 150° C. to about 300° C. above the deposition temperature or the crystallization temperature of the underlying layer). Examples of such temperatures are from about 500° C. to about 1200° C. (e.g., from about 800° C. to about 1050° C.). Thermal conditioning can be preformed under a variety of pressure conditions, such as above atmospheric pressure, below atmospheric pressure, or at atmospheric pressure. Thermal conditioning can also be performed using a variety of gas environments (e.g., an oxidizing gas environment, a reducing gas environment, or an inert gas environment).

"Deposition temperature" as used herein refers to the temperature at which the layer being conditioned was deposited.

"Crystallization temperature" as used herein refers to the temperature at which a layer of material (e.g., the underlying layer) takes on a crystalline form.

Chemical conditioning can include vacuum techniques (e.g., reactive ion etching, plasma etching and/or etching with fluorine compounds, such as $BF_3$ and/or $CF_4$). Chemical conditioning techniques are disclosed, for example, in *Silicon Processing for the VLSI Era*, Vol. 1, eds. S. Wolf and R. N. Tanber, pp. 539–574, Lattice Press, Sunset Park, Calif., 1986.

Alternatively or additionally, chemical conditioning can involve solution phase techniques, such as disclosed in *Metallurgy and Metallurgical Engineering Series*, 3d ed., George L. Kehl, McGraw-Hill, 1949. Such techniques can include contacting the surface of the underlying layer with a relatively mild acid solution (e.g., an acid solution containing less about 10 percent acid, less than about two percent acid, or less than about one percent acid). Examples of mild acid solutions include perchloric acid, nitric acid, hydrofluoric acid, hydrochloric acid, acetic acid and buffered acid solutions. In one embodiment, the mild acid solution is about one percent aqueous nitric acid. In certain embodiments, bromide-containing and/or bromine-containing compositions (e.g., a liquid bromine solution) can be used to condition the surface of a buffer layer or a superconductor layer.

This method can be used to form multiple buffer layers (e.g., two, three, four, or more buffer layers), with one or more of the buffer layers having a conditioned surface.

The method can also be used to form multiple superconductor layers, with one or more of the superconductor layers having a conditioned surface. For example, a superconductor layer can be formed and then thermally and/or chemically conditioned as described above. An additional superconductor layer can then be formed on the conditioned surface of the first superconductor layer. This process can be repeated as many times as desired.

These methods are described in commonly owned U.S. Provisional Patent Application No. 60/166,140, filed Nov. 18, 1999, and entitled "Multi-Layer Articles and Methods of Making Same," and commonly owned U.S. patent application Ser. No. 09/615,999, filed on even date herewith, and entitled "Multi-layer Articles and Methods of Making Same," both of which are hereby incorporated by reference.

In certain embodiments, the superconductor layer can be formed from a precursor composition that has a relatively small amount of free acid. In aqueous solutions, this can correspond to a precursor composition with a relatively neutral pH (e.g., neither strongly acidic nor strongly basic). The precursor composition can be used to prepare multilayer superconductors using a wide variety of materials which can be used as the underlying layer on which the superconductor layer is formed.

The total free acid concentration of the precursor composition can be less than about $1 \times 10^{-3}$ molar (e.g., less than about $1 \times 10^{-5}$ molar or about $1 \times 10^{-7}$ molar). Examples of free acids that can be contained in a precursor composition include trifluoroacetic acid, acetic acid, nitric acid, sulfuric acid, acids of iodides, acids of bromides and acids of sulfates.

When the precursor composition contains water, the precursor composition can have a pH of at least about 3 (e.g., at least about 5 or about 7).

In some embodiments, the precursor composition can have a relatively low water content (e.g., less than about 50 volume percent water, less than about 35 volume percent water, less than about 25 volume percent water).

In embodiments in which the precursor composition contains trifluoroacetic acid and an alkaline earth metal (e.g., barium), the total amount of trifluoroacetic acid can be selected so that the mole ratio of fluorine contained in the precursor composition (e.g., in the form of trifluoroacetate) to the alkaline earth metal (e.g., barium ions) contained in the precursor composition is at least about 2:1 (e.g., from about 2:1 to about 18.5:1, or from about 2:1 to about 10:1).

Superconducting articles formed from such precursor compositions can include more than one superconductor layer (e.g., two superconductor layers disposed on each other). The combined thickness of the superconductor layers can be at least about one micron (e.g., at least about two microns, at least about three microns, at least about four microns, at least about five microns, or at least about six microns). The combined critical current density of the superconductor layers can be at least about $5\times10^5$ Amperes per square centimeter (e.g., at least about $1\times10^6$ Amperes per square centimeter, or at least about $2\times10^6$ Amperes per square centimeter).

In general, the precursor compositions can be prepared by combining soluble compounds of a first metal (e.g., copper), a second metal (e.g., an alkaline earth metal), and a rare earth metal with one or more desired solvents and optionally water. As used herein, "soluble compounds" of the first, second and rare earth metals refer to compounds of these metals that are capable of dissolving in the solvent(s) contained in the precursor compositions: Such compounds include, for example, salts (e.g., nitrates, acetates, alkoxides, iodides, sulfates and trifluoroacetates), oxides and hydroxides of these metals.

These methods and compositions are described in commonly owned U.S. Provisional Patent Application Serial No. 60/166,297, filed on Nov. 18, 1999, and entitled "Superconductor Articles and Compositions and Methods for Making Same," and commonly owned U.S. patent application Ser. No. 09/616,810, filed on even date herewith, and entitled "Superconductor Articles and Compositions and Methods for Making Same," both of which are hereby incorporated by reference.

In certain embodiments, a precursor solution is formed of an organic solution containing metal trifluoroacetates prepared from powders of $BaCO_3$, $YCO_3 \cdot 3H_2O$ and $Cu(OH)_2CO_3$ combined and reacted using methods known to those skilled in the art. For example, the powders can be combined in a 2:1:3 ratio with between 20–30% (5.5–6.0 M) excess trifluoroacetic acid in methyl alcohol and then refluxed (e.g., for approximately four to ten hours) to produce a solution substantially 0.94 M based on copper content.

The precursor solution is then applied to a surface (e.g., a buffer layer surface), such as by spin coating or other techniques known to those skilled in the art.

After application to the surface (e.g, the buffer layer surface), the precursor solution is heat treated. Generally, the solution is heated at a rate of from about 0.5° C. per minute to about 10° C. per minute in moist oxygen (e.g., having a dew point in the range of from about 20° C. to about 75° C.) to a temperature in the range of from about 300° C. to about 500° C. The coating is then heated for about one hour to a temperature of less than about 860° C. (e.g., less than about 810° C.) in a moist reducing nitrogen-oxygen gas mixture (e.g., having a composition including from about 0.5% to about 5% oxygen). Optionally, the coating can be further heated to a temperature of from about 860° C. to about 950° C. for from about five to about 25 minutes. The coating is subsequently heated to a temperature of from about 400° C. to about 500° C. for at least about eight hours at in dry oxygen. The coating can then be cooled to room temperature in static dry oxygen.

These methods are described in U.S. Pat. No. 5,231,074, issued on Jul. 27, 1993, and entitled "Preparation of Highly Textured Oxide Superconducting Films from MOD Precursor Solutions," which is hereby incorporated by reference.

In some embodiments, a metal oxyfluoride is deposited using one or more standard techniques, such as metalorganic solution deposition, metalorganic chemical vapor deposition, reactive evaporation, plasma spray, molecular beam epitaxy, laser ablation, ion beam sputtering, electron beam evaporation, depositing a metal trifluoroacetate coating and decomposing the coating as described herein. Multiple layers of metal oxyfluoride may be deposited.

Other constituent metallic elements of the desired oxide superconductor are also deposited in substantially stoichiometric proportions.

The metal oxyfluoride is converted into an oxide superconductor at a rate of conversion selected by adjusting temperature, vapor pressure of gaseous water or both. For example, the metal oxyfluoride can be converted in a processing gas having a moisture content of less than 100% relative humidity (e.g., less than about 95% relative humidity, less than about 50% relative humidity, or less than about 3% relative humidity) at 25° C. to form some oxide superconductor, then completing the conversion using a processing gas having a higher moisture content (e.g., from about 95% relative humidity to about 100% relative humidity at 25° C.). The temperature for converting the metal oxyfluoride can be in the range of from about 700° C. to about 900° C. (e.g., from about 700° C. to about 835° C.). The processing gas preferably contains from about 1 volume percent oxygen gas to about 10 volume percent oxygen gas.

These methods are described in PCT Publication No. WO 98/58415, published on Dec. 23, 1998, and entitled "Controlled Conversion of Metal Oxyfluorides into Superconducting Oxides," which is hereby incorporated by reference.

In certain embodiments, the preparation of the superconductor layer includes using a precursor composition containing a trifluoroacetate salt of one or more metals and a controlled total water content (e.g., controlled content of liquid water in the precursor composition and controlled content of water vapor in the surrounding environment) present when treating the precursor composition to form an intermediate of the superconductor layer (e.g., a metal oxyfluoride intermediate of the superconductor layer). For example, the precursor composition can have a relatively low water content (e.g., less than about 50 volume percent water, less than about 35 volume percent water, or less than about 25 volume percent water) and/or a relatively high solids content, whereas the surrounding gas environment can have a relatively high vapor pressure of water (e.g., from about 5 Torr to about 50 Torr water, from about 5 Torr to about 30 Torr water, or from about 10 Torr to about 25 Torr water). The superconductor layer intermediate (e.g., metal oxyfluoride intermediate) can be formed in a relatively short period of time (e.g., less than about five hours, less than about three hours, or less than about one hour).

Treating the precursor composition can include heating the precursor composition from an initial temperature (e.g., room temperature) to a temperature of from about 190° C. to about 215° C. (e.g., about 210° C.) at a rate of at least about 5° C. per minute (e.g., at least about 8° C. per minute, or at least about 10° C. per minute) in a water vapor pressure of from about 5 Torr to about 50 Torr water vapor (e.g., from about 5 Torr to about 30 Torr water vapor, or from about 10 Torr to about 25 Torr water vapor). The nominal partial pressure of oxygen can be, for example, from about 0.1 Torr to about 760 Torr.

Heating is then continued to a temperature of from about 220° C. to about 290° C. (e.g., about 220° C.) at a rate of from about 0.05° C. per minute to about 0.4° C. per minute (e.g., from about 0.1° C. per minute to about 0.4° C. per minute) in a water vapor pressure of from about 5 Torr to about 50 Torr water vapor (e.g., from about 5 Torr to about 30 Torr water vapor, or from about 10 Torr to about 25 Torr water vapor). The nominal partial pressure of oxygen can be, for example, from about 0.1 Torr to about 760 Torr.

This is followed by heating to about 400° C. at a rate of at least about 2° C. per minute (e.g., at least about 3° C. per minute, or at least about 5° C. per minute) in a water vapor pressure of from about 5 Torr to about 50 Torr water vapor (e.g., from about 5 Torr to about 30 Torr water vapor, or from about 10 Torr to about 25 Torr water vapor) to form an intermediate of the superconductor material (e.g., a metal oxyfluoride intermediate). The nominal partial pressure of oxygen can be, for example, from about 0.1 Torr to about 760 Torr.

The intermediate can be heated to form the desired superconductor layer. For example, the intermediate can be heated to a temperature of from about 700° C. to about 825° C. in an environment containing from about 0.1 Torr to about 50 Torr oxygen and from about 0.1 Torr to about 150 Torr water vapor (e.g., about 12 Torr water vapor) with the balance being, for example, nitrogen and/or argon.

The method can result in a well-ordered superconductor layer (e.g., biaxially textured or cube textured) having a relatively high critical current density (e.g., at least about $5 \times 10^5$ Amperes per square centimeter).

These methods are described in commonly owned U.S. Provisional Patent Application Serial No. 60/166,145, filed on Nov. 18, 1999, and entitled "Methods and Compositions for Making a Multi-Layer Article," and commonly owned U.S. patent application Ser. No. 09/615,991, filed on even date herewith, and entitled "Methods and Compositions for Making a Multi-layer Article," both of which are hereby incorporated by reference.

In certain embodiments, a metal oxyfluoride intermediate of a superconductor material can be prepared using a process that involves relatively few temperature ramps (e.g., less than three ramps, such as two ramps).

Alternatively or additionally, forming the metal oxyfluoride can include one or more steps in which the temperature is held substantially constant (e.g., constant within about 10° C., within about 5° C., within about 2° C., within about 1° C.) for a relatively long period of time (e.g., more than about one minute, more than about five minutes, more than about 30 minutes, more than about an hour, more than about two hours, more than about four hours) after a first temperature ramp to a temperature greater than about room temperature (e.g., at least about 50° C., at least about 100° C., at least about 200° C., at least about 215° C., from about 215° C. to about 225° C., about 220° C.).

Formation of the metal oxyfluoride intermediate can involve using more than one gas environment (e.g., a gas environment having a relatively high water vapor pressure and a gas environment having a relatively low water vapor pressure) while maintaining the temperature substantially constant (e.g., constant within about 10° C., within about 5° C., within about 2° C., within about 1° C.) for a relatively long period of time (e.g., more than about one minute, more than about five minutes, more than about 30 minutes, more than about an hour, more than about two hours, more than about four hours). As an example, in a high water vapor pressure environment, the water vapor pressure can be from about 17 Torr to about 40 Torr (e.g., from about 25 Torr to about 38 Torr, such as about 32 Torr). A low water vapor pressure environment can have a water vapor pressure of less than about 1 Torr (e.g., less than about 0.1 Torr, less than about 10 milliTorr, about five milliTorr).

Generally, the metal oxyfluoride is formed by disposing a composition (e.g., a precursor solution) on a surface (e.g., a substrate surface, a buffer layer surface or a superconductor layer surface) and heating the composition. The methods of disposing the composition on the surface include spin coating, dip coating, web coating and other techniques known in the art.

Typically, in an initial decomposition step, the initial temperature in this step is about room temperature, and the final temperature is from about 215° C. to about 225° C. using a temperature ramp of 10° C. per minute or less. During this step, the partial pressure of water vapor in the nominal gas environment is preferably maintained at from about 17 Torr to about 40 Torr. The partial pressure of oxygen in the nominal gas environment can be maintained at from about 0.1 Torr to about 760 Torr. The temperature and nominal gas environment are then held substantially constant for a relatively long period of time.

After this time period, the gas environment is changed to a relatively dry gas environment (e.g., less than about one Torr water vapor, less than about 0.1 Torr water vapor, less than about 10 milliTorr water vapor, five milliTorr water vapor) while maintaining the temperature substantially constant. The temperature and nominal gas environment are then held substantially constant for a relatively long period of time.

After this time period, the nominal gas environment is maintained substantially constant and heating is continued to a temperature sufficient to form the metal oxyfluoride intermediate (e.g., about 400° C.). This step is preferably performed using a temperature ramp of 10° C. per minute or less.

The metal oxyfluoride intermediate can then be heated to form the desired superconductor layer. Typically, this step is performed by heating to a temperature of from about 700° C. to about 825° C. During this step, the nominal gas environment typically can contain from about 0.1 Torr to about 50 Torr oxygen and from about 0.1 Torr to about 150 Torr (e.g., about 12 Torr) of water vapor with the balance being nitrogen and/or argon. Preferably, the metal oxyfluoride intermediate has a relatively low defect density.

These methods are described in commonly owned U.S. patent application Ser. No. 09/616,811, filed on even date herewith, and entitled "Methods of Making A Superconductor," which is hereby incorporated by reference.

In certain embodiments, the superconducting layer can be formed from solid-state, or semi solid state, precursor materials deposited in the form of a dispersion. These precursor compositions allow for example the substantial elimination of $BaCO_3$ formation in final YBCO superconducting layers, while also allowing control of film nucleation and growth.

Two general approaches are presented for the formulation of precursor compositions. In one approach, the cationic constituents of the precursor composition are provided in components taking on a solid form, either as elements, or preferably, compounded with other elements. The precursor composition is provided in the form of ultrafine particles which are dispersed so that they can be coated onto and adhere onto the surface of a suitable substrate, intermediate-coated substrate, or buffer-coated substrate. These ultrafine particles can be created by aerosol spray, by evaporation or by similar techniques which can be controlled to provide the chemical compositions and sizes desired. The ultrafine particles are less than about 500 nm, preferably less than about 250 nm, more preferably less than about 100 nm and even more preferably less than about 50 nm. In general, the particles are less than about 50% the thickness of the desired final film thickness, preferably less than about 30% most preferably less than about 10% of the thickness of the desired final film thickness. For example, the precursor composition can comprise ultrafine particles of one or more of the constituents of the superconducting layer in a substantially stoichiometric mixture, present in a carrier. This carrier comprises a solvent, a plasticizer, a binder, a dispersant, or a similar system known in the art, to form a dispersion of such particles. Each ultrafine particle can contain a substantially compositionally uniform, homogeneous mixture of such constituents. For example, each particle can contain $BaF_2$, and rare-earth oxide, and copper oxide or rare earth/barium/copper oxyfluoride in a substantially stoichiometric mixture. Analysis of such particles would desirably reveal a rare-earth:barium:copper ratio as substantially 1:2:3 in stoichiometry, with a fluorine:barium ratio of substantially 2:1 in stoichiometry. These particles can be either crystalline, or amorphous in form.

In a second approach, the precursor components can be prepared from elemental sources, or from a substantially stoichiometric compound comprising the desired constituents. For example, evaporation of a solid comprising a substantially stoichiometric compound of desired REBCO constituents (for example, $YBa_2Cu_3O_{7-x}$) or a number of solids, each containing a particular constituent of the desired final superconducting layer (for example, $Y_2O_3$, $BaF_2$, CuO) could be used to produce the ultrafine particles for production of the precursor compositions. Alternatively, spray drying or aerosolization of a metalorganic solution comprising a substantially stoichiometric mixture of desired REBCO constituents could be used to produce the ultrafine particles used in the precursor compositions. Alternatively, one or more of the cationic constituents can be provided in the precursor composition as a metalorganic salt or metalorganic compound, and can be present in solution. The metalorganic solution can act as a solvent, or carrier, for the other solid-state elements or compounds. According to this embodiment, dispersants and/or binders can be substantially eliminated from the precursor composition. For example, the precursor composition can comprise ultrafine particles of rare-earth oxide and copper oxide in substantially a 1:3 stoichiometric ratio, along with a solublized barium-containing salt, for example, barium-trifluoroacetate dissolved in an organic solvent, such as methanol.

If the superconducting layer is of the REBCO type, the precursor composition can contain a rare earth element, barium, and copper in the form of their oxides; halides such as fluorides, chlorides, bromides and iodides; carboxylates and alcoholates, for example, acetates, including trihaloacetates such as trifluroracetates, formates, oxalates, lactates, oxyfluorides, propylates, citrates, and acetylacetonates, and, chlorates and nitrates. The precursor composition can include any combination of such elements (rare earth element, barium, and copper) in their various forms, which can convert to an intermediate containing a barium halide, plus rare earth oxyfluoride and copper(oxyfluoride) without a separate decomposition step or with a decomposition step that is substantially shorter than that which may be required for precursors in which all constituents are solubilized, and without substantial formation of $BaCO_3$, and which can subsequently be treated using high temperature reaction processes to yield an epitaxial REBCO film with $T_c$ of no less than about 89 K, and $J_c$ greater than about 500,000 $A/cm^2$ at a film thickness of 1 micron or greater. For example, for a $YBa_2Cu_3O_{7-x}$ superconducting layer, the precursor composition could contain barium halide (for example, barium fluoride), yttrium oxide (for example, $Y_2O_3$), and copper oxide; or yttrium oxide, barium trifluoroacetate in a trifluoroacetate/methanol solution, and a mixture of copper oxide and copper trifluoroacetate in trifluoroacetate/methanol. Alternatively, the precursor composition could contain Ba-trifluoroacetate, $Y_2O_3$, and CuO. Alternatively, the precursor composition could contain barium trifluoroacetate and yttrium trifluoroacetate in methanol, and CuO. Alternatively, the precursor composition could contain $BaF_2$ and yttrium acetate and CuO. In some preferred embodiments, barium-containing particles are present as $BaF_2$ particles, or barium fluoroacetate. In some embodiments the precursor could be substantially a solublized metalorganic salt containing some or all of the cation constituents, provided at least a portion of one of the compounds containing cation constituents present in solid form. In certain embodiments, the precursor in a dispersion includes a binder and/or a dispersant and/or solvent(s).

The precursor compositions can be applied to substrate or buffer-treated substrates by a number of methods, which are designed to produce coatings of substantially homogeneous thickness. For example, the precursor compositions can be applied using spin coating, slot coating, gravure coating, dip coating, tape casting, or spraying. The substrate is desirably uniformly coated to yield a superconducting film of from about 1 to 10 microns, preferably from about 1 to 5 microns, more preferably from about 2 to 4 microns.

More details are provided in commonly owned U.S. patent application Ser. No. 09/500,717, filed on Feb. 9, 2000, and entitled "Coated Conductor Thick Film Precursor," which is hereby incorporated by reference in its entirety.

In particular embodiments, methods can be employed to minimize the formation of undesirable a-axis oriented oxide layer grains, by inhibiting the formation of the oxide layer until the required reaction conditions are attained.

Conventional processes developed for decomposition and reaction of fluoride-containing precursors use a constant, and low, non-turbulent flow of process gas that is introduced into the decomposition furnace in an orientation that is parallel to the film surface, resulting in a stable boundary layer at the film/gas interface. In the apparatus types typically used for oxide layer precursor decomposition and reaction, the diffusion of gaseous reactants and products through this gas/film boundary layer appears to control the overall reaction rates. In thin, small area films (for example, less than about 0.4 microns thick and less than about a square centimeter), the diffusion of $H_2O$ into the film and the diffusion of HF out of the film occur at rates such that the formation of the $YBa_2Cu_3O_{7-x}$ phase does not begin at any significant rate until the sample reaches the processing temperature. However, as the film thickness or area increases, the rates of gaseous diffusion into and out of the film decrease, all other parameters being equal. This results in longer reaction times and/or incomplete formation of the $YBa_2Cu_3O_{7-x}$ phase, resulting in reduced crystallographic texture, lower density, and reduced critical current density.

Thus, the overall rate of $YBa_2Cu_3O_{7-x}$ phase formation is determined, to a significant extent, by the diffusion of gases through the boundary layer at the film surface.

One approach to eliminating these boundary layers is to produce a turbulent flow at the film surface. Under such conditions, the local gas composition at the interface is maintained essentially the same as in the bulk gas (that is, the $pH_2O$ is constant, and the pHF is approximately zero). Thus, the concentration of the gaseous products/reactants in the film is not controlled by the diffusion through the gas/film surface boundary layer condition, but rather by diffusion through the film. In order to minimize the nucleation of a-axis $YBa_2Cu_3O_{7-x}$ oriented grains on a substrate surface, the formation of the $YBa_2Cu_3O_{7-x}$ phase is inhibited until desired process conditions are reached. For example, the formation of the $YBa_2Cu_3O_{7-x}$ phase can be inhibited until desired process temperature is reached.

In one embodiment, a combination of: 1) low (non-turbulent) process gas flow, so that a stable boundary layer is established at the film/gas interface, during the ramp to temperature, and 2) high (turbulent) process gas flow, so that the boundary layer is disrupted at the film/gas interface, is employed. For example, in a three inch tube furnace, the flow can be from about 0.5 to about 2.0 L/min during the temperature ramp from ambient temperature to the desired process temperature. Thereafter, the flow can be increased to a value of from about 4 to about 15 L/min during the time at which the film is being processed. Thus, the rate of formation of $YBa_2Cu_3O_{7-x}$ and epitaxial texture formation can be increased at high temperature, while minimizing the amount of unwanted a-axis nucleation and growth at low temperature during ramp up. According to these processes, a-axis nucleated grains are desirably present in an amount of less than about 1%, as determined by scanning electron microscopy.

More details are provided in commonly owned U.S. patent application Ser. No. 09/616,566, filed on even date herewith, and entitled "Control of Oxide Layer Reaction Rates," which is hereby incorporated by reference.

Figure 1B:
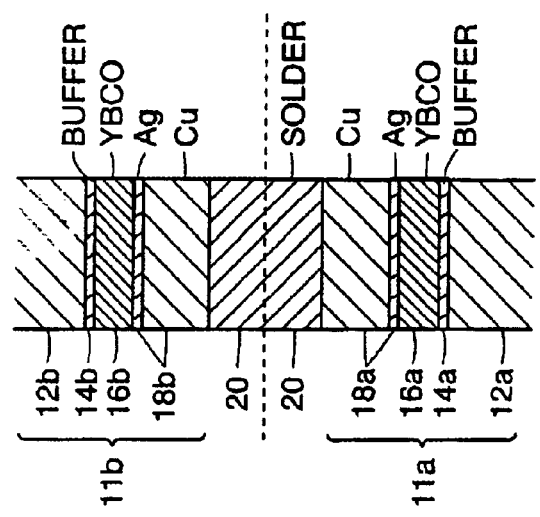
FIG. 1B is an illustration of an expanded view of FIG. 1A.

Referring now to FIGS. 1A and 1B, a conductor 10 formed in accordance with the present invention is shown. FIG. 1 shows this in the simplest configuration, where two tapes are bonded face to face. As described hereinbefore, each tape includes a substrate which can be a metal or alloy, and is preferably a nonmagnetic alloy; a buffer layer which can include single or multiple layers formed of oxides, nitrides and/or metals; and, the superconducting layer which is typically YBCO or alternatively with a rare earth substituted for the Y. An additional cap layer may be deposited, which is most preferably silver and could incorporate as an option an additional normal metal layer to provide thermal and electrical mass. This conductor can be bonded to the cap layer of another tape at mirror image using soldering, diffusion bonding or other similar processes.

More specifically, conductor 10 is formed of two coated conductor tapes 11a and 11b in a sandwich configuration. As shown in FIGS. 1A and 1B, conductor 11a includes substrate 12a, buffer layer 14a, HTS layer 16a, and cap layer 18a. Likewise, conductor 11b includes substrate 12b, buffer layer 14b, HTS layer 16b and cap layer 18b.

Conductors 11a and 11b can be formed using known processes, such as for example the IBAD, DeTex, epitaxial deposition processes as described above. Preferably, substrates 12a and 12b are nonmagnetic and are formed using one of the above-described DeTex processes.

Buffer layers 14a and 14b are preferably deposited epitaxially using one of the above-described methods. Buffer layers 14a and 14b each may be formed of one or more layers. Exemplary buffer layer materials include, but are not limited to, $CeO_2$, YSZ (yttria stabilized zirconia), $Y_2O_3$ and $SrTiO_3$. Layer 14 can be formed of any material capable of supporting layer 16. For example, layer 14 can be formed of a buffer layer material. Examples of buffer layer materials include metals and metal oxides, such as silver, nickel, $TbO_x$, $GaO_x$, $CeO_2$, yttria-stabilized zirconia (YSZ), $Y_2O_3$, $LaAlO_3$, $SrTiO_3$, $LaNiO_3$, $Gd_2O_3$, $LaCuO_3$, $SrRuO_3$, $NdGaO_3$, $NdAlO_3$ and nitrides as known in the art. A buffer material can be prepared using solution phase techniques, including metalorganic deposition, such as disclosed in, for example, S. S. Shoup et al., J. Am. Cer. Soc., vol. 81, 3019; D. Beach et al., Mat. Res. Soc. Symp. Proc., vol. 495, 263 (1988); M. Paranthaman et al., Superconductor Sci. Tech., vol. 12, 319 (1999); D. J. Lee et al., Japanese J. Appl. Phys., vol. 38, L178 (1999) and M. W. Rupich et al., I.E.E.E. Trans. on Appl. Supercon. vol. 9, 1527.

HTS layers 16a and 16b are also preferably deposited epitaxially using one of the above-described methods. HTS layers 16a and 16b include any HTS material, for example, yttrium-barium-copper-oxide superconductors (YBCO), bismuth-strontium-calcium-copper-oxide superconductors (BSCCO), and thallium based superconductors.

Cap layers 18a and 18b can each be formed of one or more layers as shown for example in FIG. 1B. Cap layers 18a and 18b preferably each include at least one noble metal layer. "Noble metal", as used herein, is a metal whose reaction products are theremodynamically unstable under the reaction conditions employed to prepare the HTS tape. Exemplary noble metals include for example silver, gold, palladium and platnium. Noble metals provide a low interfacial resistance between the HTS layer and the cap layer. In addition, cap layers 18a and 18b can each include a second layer of normal metal (e.g. Cu or Al or alloys of normal metals).

The individual conductors 11a and 11b are then joined at the respective layers using one of a variety of methods. For example, and while not to be construed as limiting, exemplary joining techniques include soldering and diffusion bonding. An exemplary solder embodiment is shown in shown in FIGS. 1A and 1B, with the resulting solder layer between the cap layers 18a and 18b being illustrated as reference numeral 20 (or the interface in the case of diffusion bonding). Alternatively, if no cap layers are used, an intervening layer, preferably metallic, may be bonded to the two HTS layers.

Figure 2A:
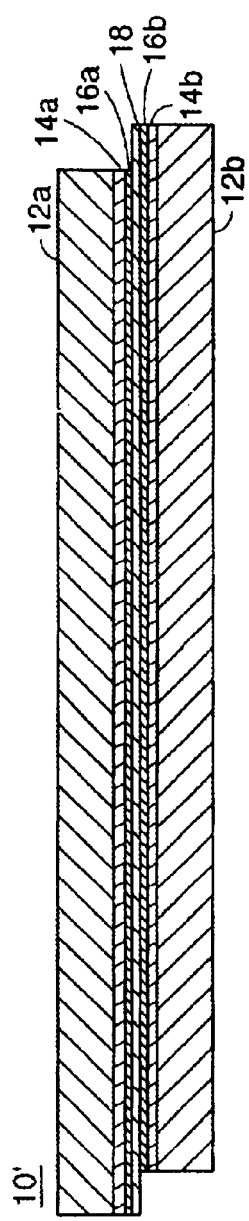
FIG. 2A is an illustration of an alternative embodiment of HTS coated conductor in accordance with the present invention.
Figure 2B:
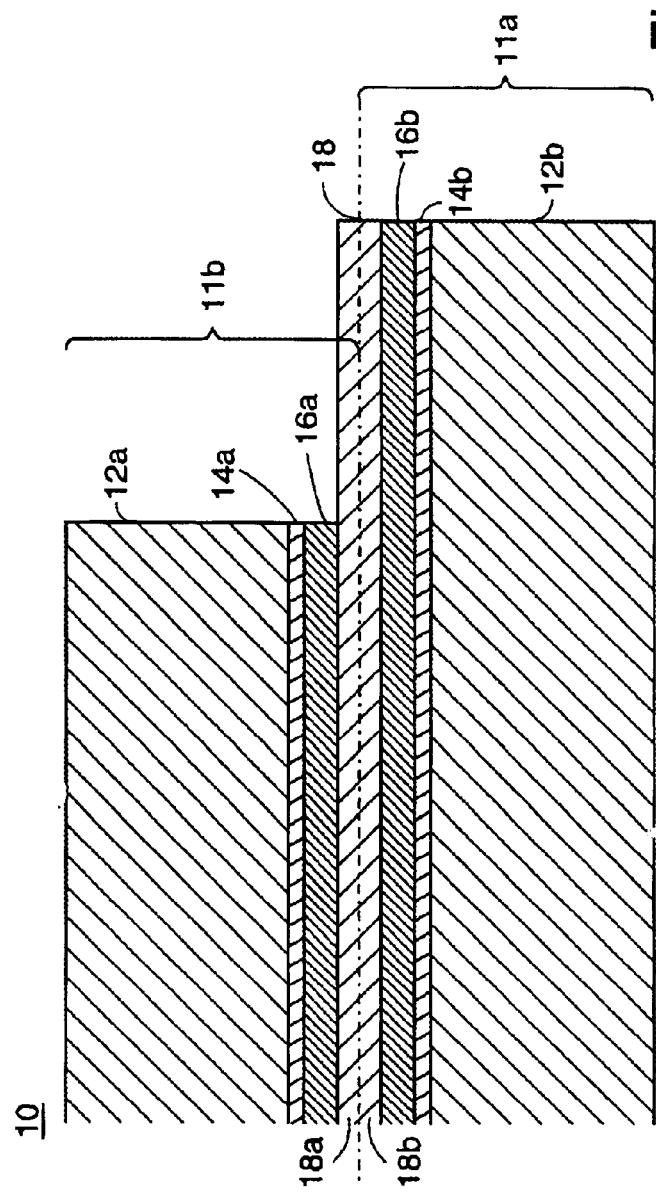
FIG. 2B is an illustration of an expanded view of FIG. 2A.

Referring now to FIGS. 2A and 2B, an alternative embodiment of the invention is illustrated. In this embodiment, conductor 10' includes conductors 11a and 11b are offset (i.e. not registered at their respective edges as shown in the figures). The offset configuration shown in this embodiment may be preferable in some circumstances because it allows for direct current transfer into the superconducting filament or layers 16a and 16b, for example, at splices and terminations, from the broad surface of the cap layers 18a and 18b, respectively, as compared to transfer from the edges of the superconducting layers 16a and 16b.

FIG. 2C depicts another alternative embodiment in accordance with the present invention. In FIG. 2C, the benefits of the offset configuration as shown in FIGS. 2A and 2B are further extended to provide current transfer to the substrates 12a and 12b by extension of the cap layers 18a and 18b respectively along the edges of the individual tapes 11a and 11b, respectively. This provides additional stability to the conductor by allowing alternate current paths and heat transfer to the substrates and subsequently to the cryogen in which the conductor 10" is immersed or exposed.

FIGS. 3A and 3B illustrate another alternative embodiment of the invention. FIGS. 3A and 3B depict a conductor 20 in which each of the superconducting layers 16a and 16b are divided into a plurality of narrower filaments 17a and 17b, respectively. It will be appreciated that the filament widths in each of layers 16a and 16b need not be of equal dimension within each layer. Nor is it necessary that the width of the filaments in the opposing layers be of equal width. The filaments are separated from one another by regions 30 which can be for example normal (i.e. non-superconducting) regions in the superconducting layers or normal (e.g. non-superconducting) metal inserted between the narrower filaments.

In the case of normal regions in the superconducting layers, the layers in region 30 would then formed of the same material as the HTS layer but treated by for example ion bombardment to suppress superconductivity. This can be accomplished for example ion bombardment prior to deposition of the cap layers 18a and 18b. Alternatively, ion bombardment can be used following cap layer deposition.

In the case of normal metal inserted in regions 30, the material from the superconducting layer can be removed from region 30 prior to cap layer deposition and the cap layer material can be inserted therefor. This is typically done simultaneously with the cap layer deposition. It will be appreciated that some or all of the width of regions 30 can be varied (independent of one another) to increase the volume of the normal metal alternative current paths. Preferably, the filaments in the opposing layers with be offset with respect to one another, thereby providing current sharing between multiple filaments. This can be implemented within each layer and/or opposing layers.

FIGS. 3A and 3B further show edge layers 32 which may be formed of cap layer materials as described hereinabove. This is similar to the extension of the cap layers 18a and 18b discussed in connection with FIG. 2C. As discussed above, this provides additional stability to the conductor by allowing alternate current paths and heat transfer to the substrates and subsequently to the cryogen in which the conductor 10" is immersed or exposed.

FIGS. 4A and 4B illustrate yet another embodiment of the invention. In this embodiment, an additional stabilizer 70 is included along with cap layers 18a and 18b. This allows a cost effective alternative in siutations where additional stabilizer may be desirable or necessary. For example, stabilizer 70 can be formed of copper, aluminum or the like.

It is anticipated that practical conductors can be produced by laminating two individual tapes face-to-face such that a conductive metal layer 18 is disposed between the superconducting filaments with the buffer layer and substrate on the outside of the stack up.

In some embodiments, coated conductors can be fabricated in a way that minimizes losses incurred in alternating current applications. The conductors are fabricated with multiple conducting paths, each of which comprises path segments which extend across at least two conducting layers, and further extend between these layers.

Each superconducting layer has a plurality of conductive path segments extending across the width of the layer, from one edge to another, and the path segments also have a component of direction along the length of the superconducting layer. The path segments in the superconducting layer surface are in electrically conductive communication with interlayer connections, which serve to allow current to flow from one superconducting layer to another. Paths, which are made up of path segments, are periodically designed, so that current flow generally alternates between two superconducting layers in bilayered embodiments, and traverses the layers through interlayer connections.

Superconducting layers can be constructed to contain a plurality of path segments which extend both across their widths and along their lengths. For example, superconducting layers can be patterned so as to achieve a high resistivity or a fully insulating barrier between each of the plurality of path segments. For example, a regular periodic array of diagonal path segments can be imposed on the layer along the full length of the tape. Patterning of superconducting layers to give such arrays can be accomplished by a variety of means known to those skilled in the art, including for example, laser scribing, mechanical cutting, implantation, localized chemical treatment through a mask, and other known methods. Further, the superconducting layers are adapted to allow the conductive path segments in their surfaces to electrically communicate with conducting interlayer connections passing between the layers, at or near their edges. The interlayer connections will typically be normally conducting (not superconducting) but in special configurations could also be superconducting. Interlayer connections provide electrical communication between superconducting layers which are separated by non-conducting or highly resistive material which is positioned between the superconducting layers. Such non-conducting or highly resistive material can be deposited on one superconducting layer. Passages can be fabricated at the edges of the insulating material to allow the introduction-of interlayer connections, followed by deposition of a further superconducting layer. One can achieve a transposed configuration with coated conductors by patterning a superconducting layer into filaments parallel to the axis of the tape and winding the tape in a helical fashion around a cylindrical form.

More details are provided in commonly owned U.S. patent application Ser. No. 09/500,718, filed on Feb. 9, 2000, and entitled "Coated Conductors with Reduced AC Loss," which is hereby incorporated by reference in its entirety.

The basic "face-to-face" architectures in accordance with the present invention provide a number of significant benefits. For example, the HTS films are located near the center line of the conductor cross section. During bending, for example during coil winding or cable fabrication, the HTS films are near the lowest strain region in the conductor. Conventional mechanics of solids calculations show that the strain tolerance of this architecture will be significantly improved relative to open faced tapes.

In addition, the electrical stability of the conductor can be significantly improved over a single HTS layer configuration. While electrical current transport is much more difficult in normal metals (e.g. silver) relative to the HTS film, current can transfer over some calculable length from one filament to another through the cap layer structure. This current transfer allows the two face-to-face filaments to provide a redundant current path, improving the stability against quench and reducing the sensitivity to local defects and variations in performance.

Moreover, it is expected that this architecture will also provide considerable benefits for some alternating current applications in which the magnetic field is oriented primarily parallel to the plane of the conductor and the magnetic flux fully penetrates the entire conductor. For example, in ac superconducting coils such as superconducting transformers, magnetic fields in the coils are parallel to the surfaces of the tape conductor, except at the coil ends. In addition, the amplitude of the magnetic field is usually larger than the penetration field for the superconducting layers. According to the Critical State Model, the hysteretic loss of a pair of superconducting layers without transport current in fully penetrating parallel fields is the sum of three terms, one of which is proportional to the ratio of distance between layers to layer height and thickness. Using the following typical parameters (superconducting layer of 2 microns, substrate of 50 microns, buffer layers of 0.6 microns, silver cap layer of 4 microns, solder layer of 15 microns, critical current density of 1 $MA/cm^2$, and peak-to-peak field amplitude of 0.1 Tesla), the ratio of hysteretic loss of a conductor with a face-to-face architecture to that of a conductor with a back-to-back architecture is calculated to be approximately 0.25. Lower loss is expected in ac power transmission cables with multiple layers of conductor when the current is operated at sufficient levels so that the magnetic flux fully penetrates the entire conductor in the outer layers.

In direct current applications, additional face-to-face wires would then be bundled or stacked to provide for the required total ampacity and geometry for a given application.

The simple face-to-face geometry can be readily extended to provide additional functionality and application benefits. Other laminate layers may also be bonded to the outsides or substrates of the face-to-face structure. The laminate layer or layers can be chosen for a variety of purposes provided they keep the operational HTS layer within a neutral mechanical axis zone under bending. These purposes include their electrical, magnetic, thermal, mechanical, environmental, or other properties. For example, the laminate layer can have high conductivity and so act as an effective additional electrical stabilizer and also as a means of electrical contact to the superconductor, permitting compact terminations. Alternatively, the laminate layer can have high resistivity and high heat capacity, so as to provide thermal stabilization in a current limiting event without shorting out the superconducting material in its normal state. Further, the laminate layer can be chosen for high strength in mechanically demanding applications, or for specific thermal expansion characteristics to put the superconductor under precompression. In special cases, certain magnetic properties can be desirable. Multiple laminate layers can also be desirable, for example, to mechanically and environmentally protect the insert from both sides. Laminates can be bonded to an underlying layer by means of a bonding layer such as a thin layer of solder or glue (for example, an epoxy) or by a direct thermal or mechanical bonding process. A slight offset or overlap at one edge of the tape, as shown in FIGS. 2A and 2B, can be used to provide direct access to the film surface for enhanced current transfer into the tape at splices and/or edge terminations.

An additional embodiment would build on the offset configuration as shown in FIG. 3. In this case the HTS film on the surface of the tapes could be treated to produce local breaks, nonsuperconducting regions or stripes in the HTS film only along the length of the tape (in the current flow direction). The cap layer deposited onto the HTS film would then serve to bridge the nonsuperconducting zones with a ductile normal metal region. An offset in the edge justification of the narrow stripes or filaments, similar to a running bond brick pattern, would allow current to transfer to several narrow superconducting filaments both across the cap layers and to adjacent filaments, further increasing the redundancy and improving stability. Furthermore, this embodiment is expected to provide additional protection against defects that can propagate across the full tape width. The filament edges can act to stop cracks from running across the full width of the conductor. This functionality could also be achieved by arrangement of adjacent narrow tapes comprising the full substrate/buffer/HTS/cap stack up. This embodiment could further be extended to substitute a normal metal region along the length of the tape in place of one or more of the superconducting stripes. This normal metal strip would add stabilization and would provide additional cross sectional area through which to effect splices or terminations. Finally and as discussed above, FIG. 4 shows the running bond configuration with an additional stabilizing element such as copper.

In all embodiments, a normal metal layer could be included along the edge of the conductor to hermetically seal the HTS films and to provide for current transfer into the HTS film and, if necessary from the HTS film to the substrate.

The invention thus provides novel superconductors that allow the use of a slight offset in stack up of coated conductor tape elements to provide for effective current transfer from tape to tape. In addition, stability of the conductor is enhanced by current sharing across filaments due to the insert of normal metal at interface. The invention further allows for increased mechanical integrity of conductor stack up due to positioning of the HTS layers near the conductor center line and an ability to splice and terminate stacked HTS coated conductors without splitting.

It is to be understood that while the invention has been described in conjunction with the detailed description thereof, the forgoing description is intended to illustrate and not limit the scope of the invention, which is defined by the scope of the appended claims. Other aspects, advantages, and modifications are within the scope of the following claims.

What is claimed is:

1. A multi-layer high temperature superconductor, comprising:
   a first high temperature superconductor coated element, comprising:
      a first substrate;
      at least one first buffer deposited on the first substrate;
      at least one first high temperature superconductor layer supported by the first buffer; and
      a first metallic cap layer supported by the first high temperature superconductor layer;
   a second high temperature superconductor coated element, comprising:
      a second substrate;
      at least one second buffer deposited on the second substrate;
      at least one second high temperature superconductor layer supported by the second buffer; and
      a second metallic cap layer supported by the second high temperature superconductor layer; and
   an intervening metallic layer disposed between and joining the first and second metallic cap layers so that the first and second metallic cap layers are between the first and second high temperature superconductor layers.

2. The superconductor of claim 1, wherein the first substrate is biaxially textured.

3. The superconductor of claim 2, wherein the biaxial texturing is by deformation texturing.

4. The superconductor of claim 3, wherein the first substrate comprises nickel.

5. The superconductor of claim 4, wherein the first substrate comprises nickel-chromium, nickel-copper, or nickel-vanadium alloys.

6. The superconductor of claim 5, wherein the first substrate comprises a nickel-chromium alloy.

7. The superconductor of claim 2, wherein the at least one first buffer is epitaxially deposited.

8. The superconductor of claim 1, wherein the at least one first buffer comprises metal oxides.

9. The superconductor of claim 8, wherein the metal oxides comprise cerium oxide and gadolinium oxide.

10. The superconductor of claim 8, wherein the first buffer comprises yttria stabilized zirconia.

11. The superconductor of claim 1, wherein the at least one first buffer comprises at least two buffers sequentially deposited on the first substrate.

12. The superconductor of claim 1, wherein the at least one first buffer comprises three buffers sequentially deposited on the first substrate.

13. The superconductor of claim 1, wherein the first high temperature superconductor layer comprises metal oxide.

14. The superconductor of claim 1, wherein the first high temperature superconductor layer comprises rare earth oxides.

15. The superconductor of claim 14, wherein the rare earth oxides have the formula $(RE) Ba_2Cu_3O_{7-\delta}$, wherein RE is selected from the group consisting of rare earth elements and yttrium, and B is a number greater than zero and less than one.

16. The superconductor of claim 1, wherein the first cap layer is deposited on the first high temperature superconducting layer.

17. The superconductor of claim 1, wherein the first and second substrates are of substantially identical composition.

18. The superconductor of claim 1, wherein the first and second buffers are of substantially identical composition.

19. The superconductor of claim 1, wherein the first and second high temperature superconducting layers are of substantially identical composition.

20. The superconductor of claim 1, wherein the first and second cap layers are of substantially identical composition.

21. The superconductor of claim 1, wherein the first and second high temperature superconductor coated elements are of substantially identical composition.

22. The superconductor of claim 1, wherein the first and second cap layers are continuously joined at their uppermost surfaces.

23. The superconductor of claim 1, wherein the first and second cap layers are a single continuous layer.

24. The superconductor of claim 1, wherein the superconductor is in the form of a tape.

25. The superconductor of claim 1, wherein the substrates are substantially untextured, and the buffers and high temperature superconductor layers are biaxially textured.

26. The superconductor of claim 24, wherein the first and second high temperature superconductor coated elements are registered at their respective edges.

27. The superconductor of claim 24, wherein the first and second high temperature superconductor coated elements are offset along their lengths.

28. The superconductor of claim 27, wherein at least one of the first and second cap layers extends along the edge of at least the first and second high temperature superconductor coated element.

29. The superconductor of claim 1, wherein the superconductor comprises a multifilamentary structure.

30. The superconductor of claim 29, wherein the first and second high temperature superconducting layers are divided into a plurality of filaments.

31. The superconductor of claim 1, further comprising a stabilizer, wherein the first and second cap layers are joined to opposing surfaces of the stabilizer.

* * * * *